(12) United States Patent
Perumana et al.

(10) Patent No.: US 7,113,008 B2
(45) Date of Patent: Sep. 26, 2006

(54) FREQUENCY MIXING APPARATUS

(75) Inventors: Bevin George Perumana, Atlanta, GA (US); Sudipto Chakraborty, Atlanta, GA (US); Chang-Ho Lee, Marietta, GA (US); Joy Laskar, Marietta, GA (US); Sang-Hyun Woo, Seoul (KR)

(73) Assignees: Samsung Electronics Co., Ltd., (KR); Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 11/222,011

(22) Filed: Sep. 8, 2005

(65) Prior Publication Data

US 2006/0057998 A1    Mar. 16, 2006

Related U.S. Application Data

(60) Provisional application No. 60/607,921, filed on Sep. 8, 2004.

(30) Foreign Application Priority Data

Mar. 11, 2005  (KR) .................... 10-2005-0020622

(51) Int. Cl.
*H03B 19/00* (2006.01)
(52) U.S. Cl. ..................... 327/113; 455/313
(58) Field of Classification Search ............... 327/113, 327/530, 534, 575, 537, 39, 355, 356, 357, 327/358, 359; 455/313; 330/252, 311
See application file for complete search history.

(56) References Cited

U.S. PATENT DOCUMENTS

| | | | |
|---|---|---|---|
| 3,917,964 A | 11/1975 | Carlson | |
| 5,481,221 A * | 1/1996 | Gariboldi et al. | 327/536 |
| 6,104,068 A | 8/2000 | Forbes | |
| 6,456,170 B1 * | 9/2002 | Segawa et al. | 331/143 |
| 6,927,619 B1 * | 8/2005 | Doyle | 327/534 |

FOREIGN PATENT DOCUMENTS

| | | |
|---|---|---|
| EP | 0 837 556 | 4/1998 |
| WO | WO 01/54266 | 7/2001 |

* cited by examiner

*Primary Examiner*—Henry Choe
(74) *Attorney, Agent, or Firm*—Dilworth & Barrese LLP

(57) ABSTRACT

A frequency mixing apparatus is provided. In the frequency mixing apparatus, a PMOS transistor is coupled to an NMOS transistor in a cascode configuration and an LO signal is applied to the bulks of the PMOS and NMOS transistors so that an input signal applied to their gates is mixed with the LO signal. High isolation between the bulks and gates of the transistors resulting from application of the LO signal to the bulks prevents leakage of the LO signal, thereby decreasing a DC offset voltage. This renders the frequency mixing applicable to a DCR. Also, due to the cascode configuration similar to an inverter configuration, the frequency mixing apparatus can be incorporated in an FPGA of a MODEM in SDR applications. Frequency mixing based on switching of a threshold voltage decreases a noise factor and enables frequency mixing in a low supply voltage range, thereby decreasing power consumption.

5 Claims, 3 Drawing Sheets

FREQUENCY MIXING APPARATUS

PRIORITY

This application claims priority under 35 U.S.C. § 119 to a provisional application entitled "Harmonic Frequency Converter Using Four Terminal Square Law" filed in the U.S. Patent Office on Sep. 8, 2004 and assigned Ser. No. 60/607,921 and an application entitled "Frequency Mixing Apparatus" filed in the Korean Intellectual Property Office on Mar. 11, 2005 and assigned Ser. No. 2005-20622, the contents of which are incorporated herein by reference.

BACKGROUND OF THE INVENTION

1. Field of the Invention

The present invention relates generally to a frequency mixing apparatus, and in particular, to a frequency mixing apparatus in which a P-channel metal oxide semiconductor (PMOS) transistor is coupled to an N-channel metal oxide semiconductor (NMOS) transistor in a cascode configuration and a local oscillator (LO) signal is applied to the bulks of the PMOS and NMOS transistors so that an input signal applied to their gates is mixed with the LO signal.

2. Description of the Related Art

Typically, a mixer is used for frequency conversion when designing a radio frequency (RF) transceiver in a mobile communication system. Since this mixer relies on the non-linearity of diodes or metal-semiconductor field effect transistors (MESFETs), a large number of harmonic waves and intermodulation distortion (IMD) signals are produced when an RF or intermediate frequency (IF) signal and a LO signal are applied.

FIG. 1 is a circuit diagram of a conventional frequency mixer. Referring to FIG. 1, the frequency mixer is a kind of multiplier. An output signal $V_{out}$ is the product of an input signal $V_{in}$ and a LO signal $V_{LO}$. That is, the output signal $V_{out}$ is a signal having the voltage level of the input signal $V_{in}$ at the frequency of the LO signal $V_{LO}$.

The frequency mixer includes three differential amplifiers. A differential amplifier with two transistors Q1 and Q2 generates an output proportional to the difference between inputs $V_{in}$, that is, the difference between the collector currents of the transistors Q1 and Q2, $I_{C1}-I_{C2}$. Specifically, as the input signal $V_{in}$ swings between positive (+) and negative (−) values, the collector currents $I_{C1}$ and $I_{C2}$ flowing through the transistors Q1 and Q2 also swing.

The collector current $I_{C1}$ of the transistor Q1 is the output current of another differential amplifier with transistors Q3 and Q4. The collector current $C_{C2}$ of the transistor Q2 is the output current of a third differential amplifier with transistors Q5 and Q6. These two differential amplifiers generate outputs proportional to the difference between LO signals $V_{LO}$. More specifically, along with the swing of the LO signal $V_{LO}$, the outputs $(I_{C3}-I_{C5})$ and $(I_{C4}-I_{C6})$ of the differential amplifiers also swing in opposite directions. Consequently, each of the transistor pairs Q3 & Q4 and Q5 & Q6 can be replaced with complementary switches. When viewed as switches, the two transistors Q3 and Q6 are turned on/off simultaneously and the two transistors Q4 and Q5 are also turned on/off simultaneously.

Current $I_{L1}$ flowing through a resistor $R_{L1}$ is the sum of the collector current $I_{C3}$ of the transistor Q3 and the collector current $I_{C5}$ of the transistor Q5. Current $I_{L2}$ flowing through a resistor $R_{L2}$ is the sum of the collector current $I_{C4}$ of the transistor Q4 and the collector current $I_{C6}$ of the transistor Q6.

Therefore, the differential amplifier with the transistors Q1 and Q2 operates depending on the operations of the differential amplifier with the transistors Q3 and Q4 and the differential amplifier with the transistors Q5 and Q6. This means that the output signal $V_{out}$ is equivalent to the waves of the input signal $V_{in}$ at the voltage level of the LO signal $V_{LO}$. This type of frequency mixer is typical and its output signal $V_{out}$ is expressed as $V_{out}=R_L/R_E \cdot V_{in} \cdot V_{LO}$.

The above conventional frequency mixer mixes frequencies by controlling the switching of the input signal by means of the LO signal. It exhibits the drawbacks of very poor linearity, unavailability in a low supply voltage range, great power consumption in the case of increasing the supply voltage range, and the increase of high direct current (DC) offset voltage level caused by leakage current of transistors.

SUMMARY OF THE INVENTION

An object of the present invention is to substantially solve at least the above problems and/or disadvantages and to provide at least the advantages described below. Accordingly, an object of the present invention is to provide a frequency mixing apparatus with transistors coupled in a cascode configuration, for operating in a low supply voltage range.

Another object of the present invention is to provide a frequency mixing apparatus having a low DC offset voltage by applying an LO signal to the bulk ports of transistors.

The above object is achieved by providing a frequency mixing apparatus. In the frequency mixing apparatus, a PMOS transistor has a source connected to a power voltage, a gate for receiving an input signal, and a bulk for receiving an LO signal, an NMOS transistor has a source connected to the ground, a drain connected to a drain of the PMOS transistor, a gate for receiving the input signal, and a bulk for receiving the LO signal. The input signal is mixed with the LO signal and the mixed signal is output through the drains of the PMOS transistor and the NMOS transistor.

The frequency mixing apparatus may further include a first capacitor serially connected between the bulk of the PMOS transistor and a port to which the LO signal is applied, a second capacitor serially connected between the bulk of the NMOS transistor and the port to which the LO signal is applied, a first resistor connected in parallel between the source and bulk of the PMOS transistor, a second resistor connected in parallel between the source and bulk of the NMOS transistor, a third resistor connected in parallel between the ground and a port which connects the drain of the PMOS transistor to the drain of the NMOS transistor, and an inductor between a port to which the input signal is applied and a port which connects the gate of the PMOS transistor to the gate of the NMOS transistor.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

Figure 1:
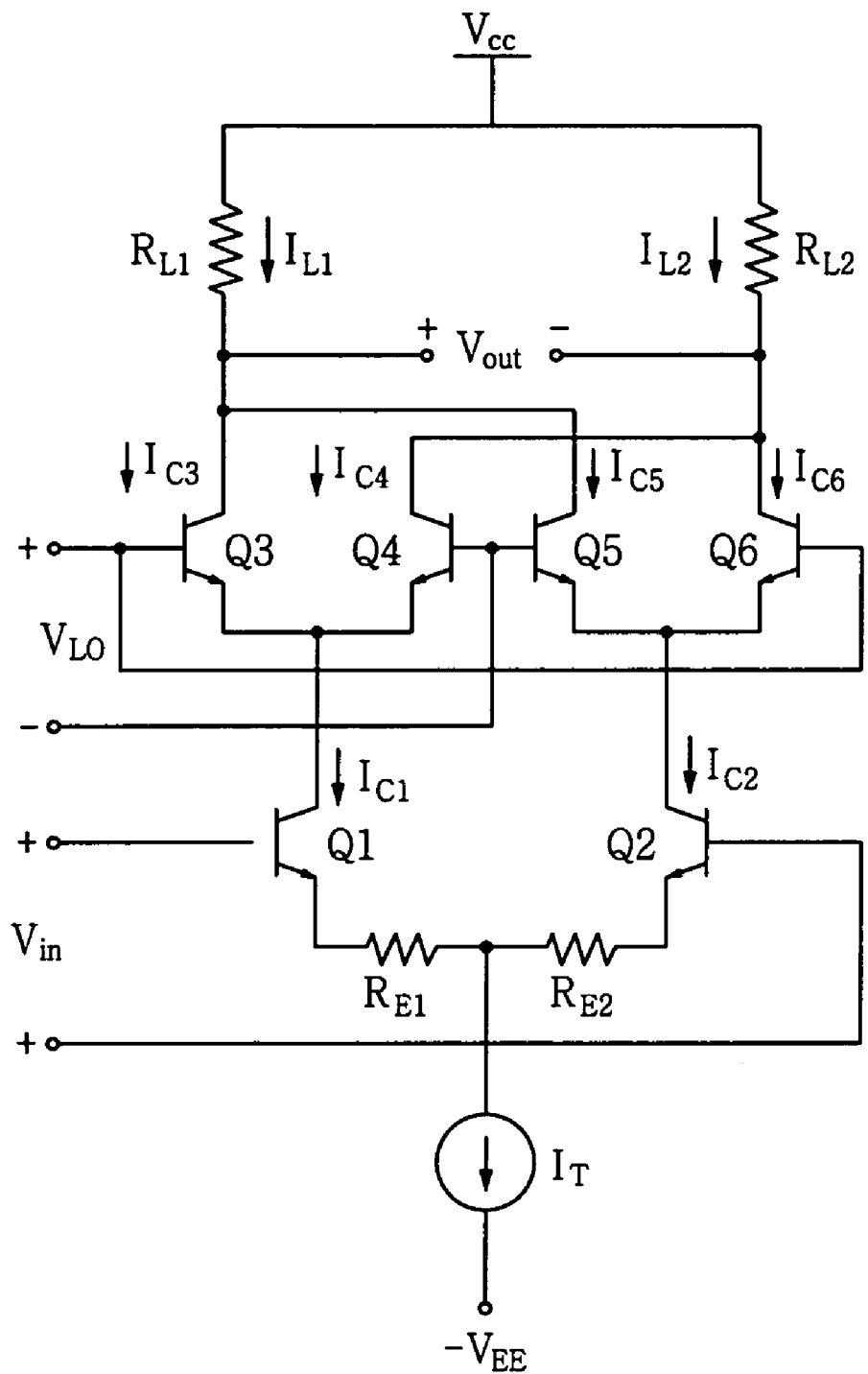
FIG. 1 is a circuit diagram of a conventional frequency mixer.
Figure 2:
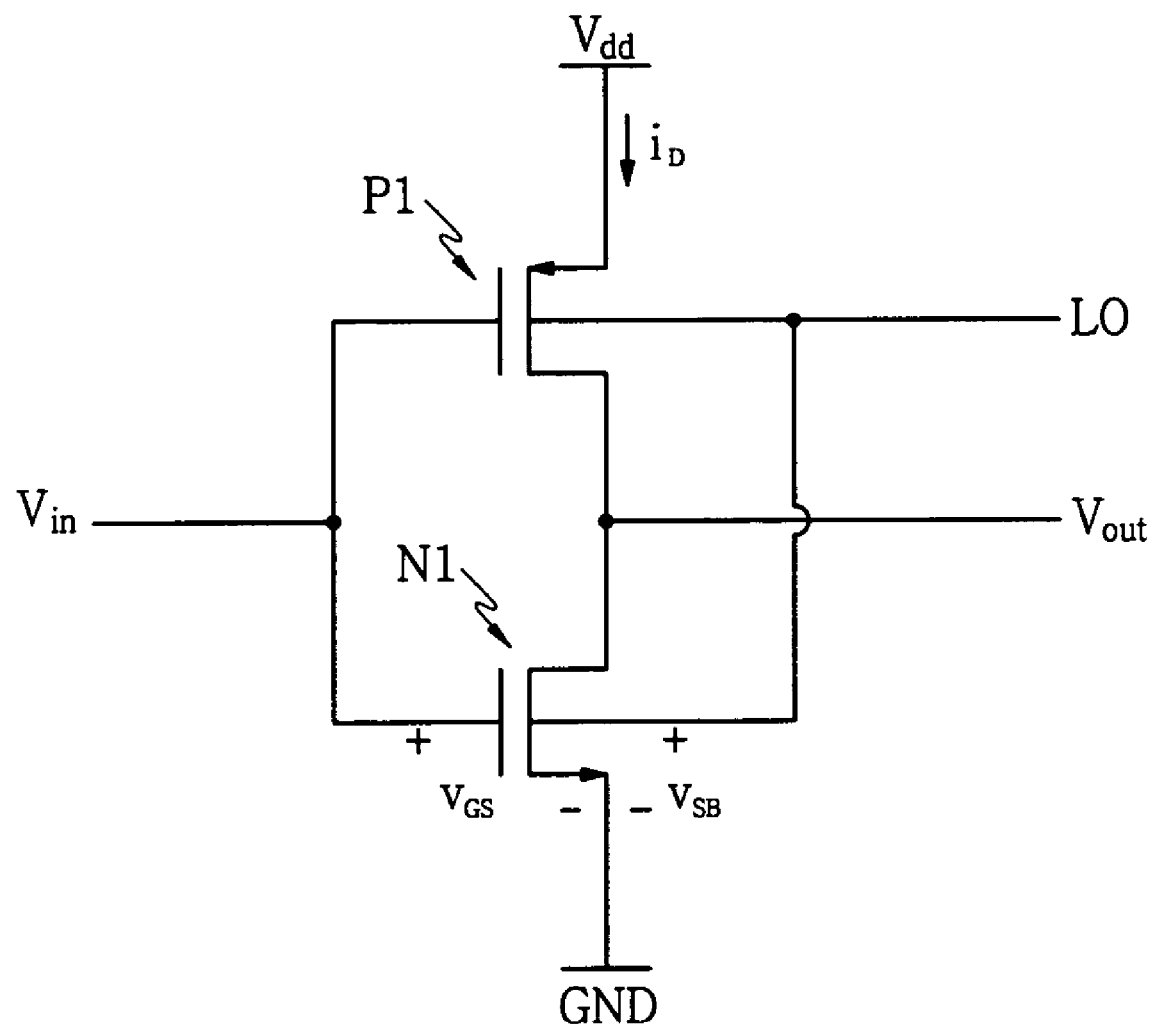
FIG. 2 is a circuit diagram of a frequency mixing apparatus according to an embodiment of the present invention.

FIG. 2 is a circuit diagram of a frequency mixing apparatus according to an embodiment of the present invention. Referring to FIG. 2, in the frequency mixing apparatus, a PMOS transistor P1 is coupled to an NMOS transistor N1 in a cascade configuration. In other words, the drain of the PMOS transistor P1 is coupled to the drain of the NMOS transistor N1.

According to the present invention, the gate of the PMOS transistor P1 is coupled to that of the NMOS transistor N1 and an input signal $V_{in}$ is applied to the gates. Also, the bulks of the PMOS transistor P1 and the NMOS transistor N1 are coupled to each other and an LO signal LO is applied to the bulks. An output signal $V_{out}$ is output from the drains of the PMOS transistor P1 and the NMOS transistor N1. The source of the PMOS transistor P1 is connected to a power voltage $V_{dd}$ and the source of the NMOS transistor N1 is grounded.

In operation, when an RF signal is applied as the input signal $V_{in}$, and it is mixed with the LO signal LO, an intermediate frequency (IF) signal is output as the output signal $V_{out}$. If the input signal $V_{in}$ is an IF signal, and it is mixed with the LO signal LO, an RF signal is output as the output signal $V_{out}$.

The principle of frequency mixing will be described with reference to mathematical formulas.

For the NMOS transistor N1, current $i_D$ is given by Equation 1:

$$i_D = \beta(v_{GS} - v_t)^2 (1 + \lambda v_{DS}) \quad (1)$$

where $\beta$ is a constant of electron mobility, oxide capacitance, device width, or device length, $v_{GS}$ is a voltage level between the gate and source of the NMOS transistor N1, $v_t$ is the threshold voltage level of the NMOS transistor N1, $\lambda$ is a channel length modulation coefficient, and $v_{DS}$ is a voltage level between the drain and source of the NMOS transistor N1.

Then $v_t$ is expressed as Equation 2:

$$v_t = v_{t0} + \gamma(\sqrt{2\phi_f + v_{SB}} - \sqrt{2\phi_f}) \quad (2)$$

where $v_{t0}$ is a threshold voltage level in the absence of body effect, $\gamma$ is a body effect coefficient, $\phi_f$ is a work function, and $v_{SB}$ is a voltage level between the source and bulk of the NMOS transistor N1.

Equation 1 and Equation 2 combine to yield Equation 3:

$$(v_{GS} - v_t)^2 = (v_{GS} - v_{t0} - \gamma(\sqrt{2\phi_f + v_{SB}} - \sqrt{2\phi_f}))^2 \quad (3)$$

Using a Taylor series expansion for $\sqrt{2\phi_f + v_{SB}} - \sqrt{2\phi_f}$, the following Equation 4 results:

$$(v_{GS} - v_t)^2 = \left(v_{GS} - v_{t0} - \gamma\sqrt{2\phi_f}\left(\frac{1}{2}\left(\frac{v_{SB}}{2\phi_f}\right) - \frac{1}{8}\left(\frac{v_{SB}}{2\phi_f}\right)^2 + \frac{1}{16}\left(\frac{v_{SB}}{2\phi_f}\right)^3 - \ldots\right)\right)^2 \quad (4)$$

Equation 4 is in the form of $(a-b)^2$. Conversion of Equation 4 to the form of $2ab$ leads to Equation 5:

$$2v_{GS}v_t = 2(v_{GS} - v_t)\gamma\sqrt{2\phi_f}\left(\frac{1}{2}\left(\frac{v_{SB}}{2\phi_f}\right) - \frac{1}{8}\left(\frac{v_{SB}}{2\phi_f}\right)^2 + \frac{1}{16}\left(\frac{v_{SB}}{2\phi_f}\right)^3 - \ldots\right) \quad (5)$$

Equation 5 reveals that with application of the LO signal LO to the bulks of the PMOS transistor P1 and the NMOS transistor N1, subharmonic mixing is facilitated. For harmonic mixing, conversion gains can be derived from Equation 5.

The term $(v_{GS} - v_t)$ is expressed as Equation 6:

$$(v_{GS} - v_t) = A'_1 + B'_1 \cos(w_{RF} t) = \frac{A_1 + B_1 \cos(w_{RF} t)}{2\gamma\sqrt{2\phi_f}} \quad (6)$$

where $A'_1$, $B'_1$, $A_1$ and $B_1$ are constants and $w_{RF}$ is an RF frequency.

$V_{SB}$ is expressed by Equation 7:

$$v_{SB} = A'_2 + B'_2 \cos(w_{LO} t) = [A_2 + B_2 \cos(w_{LO} t)] 2\phi_f \quad (7)$$

where $A'_2$, $B'_2$, $A_2$ and $B_2$ are constants and $w_{LO}$ is an LO frequency.

Since an RF signal is applied as $V_{GS}$ and the LO signal is applied as $V_{SB}$, under the assumption that $(v_{GS} - v_t)$ and $V_{SB}$ are given as Equation 6 and Equation 7, respectively, harmonic conversion gains are determined, according to Equation 5, by Equation 8, Equation 9 and Equation 10.

Frequency conversion by the LO frequency is represented by Equation 8:

$$1X: \frac{1}{4} B_1 B_2 [\cos\{(w_{RF} - w_{LO})t\} + \cos\{(w_{RF} - w_{LO})t\}] \quad (8)$$

Frequency conversion by 2×LO frequency is represented by Equation 9:

$$2X: \frac{1}{32} B_1 (B_2)^2 [\cos\{(w_{RF} - 2w_{LO})t\} + \cos\{(w_{RF} - 2w_{LO})t\}] \quad (9)$$

Frequency conversion by 3×LO frequency is represented by Equation 10:

$$3X: \frac{1}{128} B_1 (B_2)^3 [\cos\{(w_{RF} - 3w_{LO})t\} + \cos\{(w_{RF} - 3w_{LO})t\}] \quad (10)$$

In this way, frequency mixing is carried out utilizing not the change of the drain current but the change of the threshold voltage.

Figure 3:
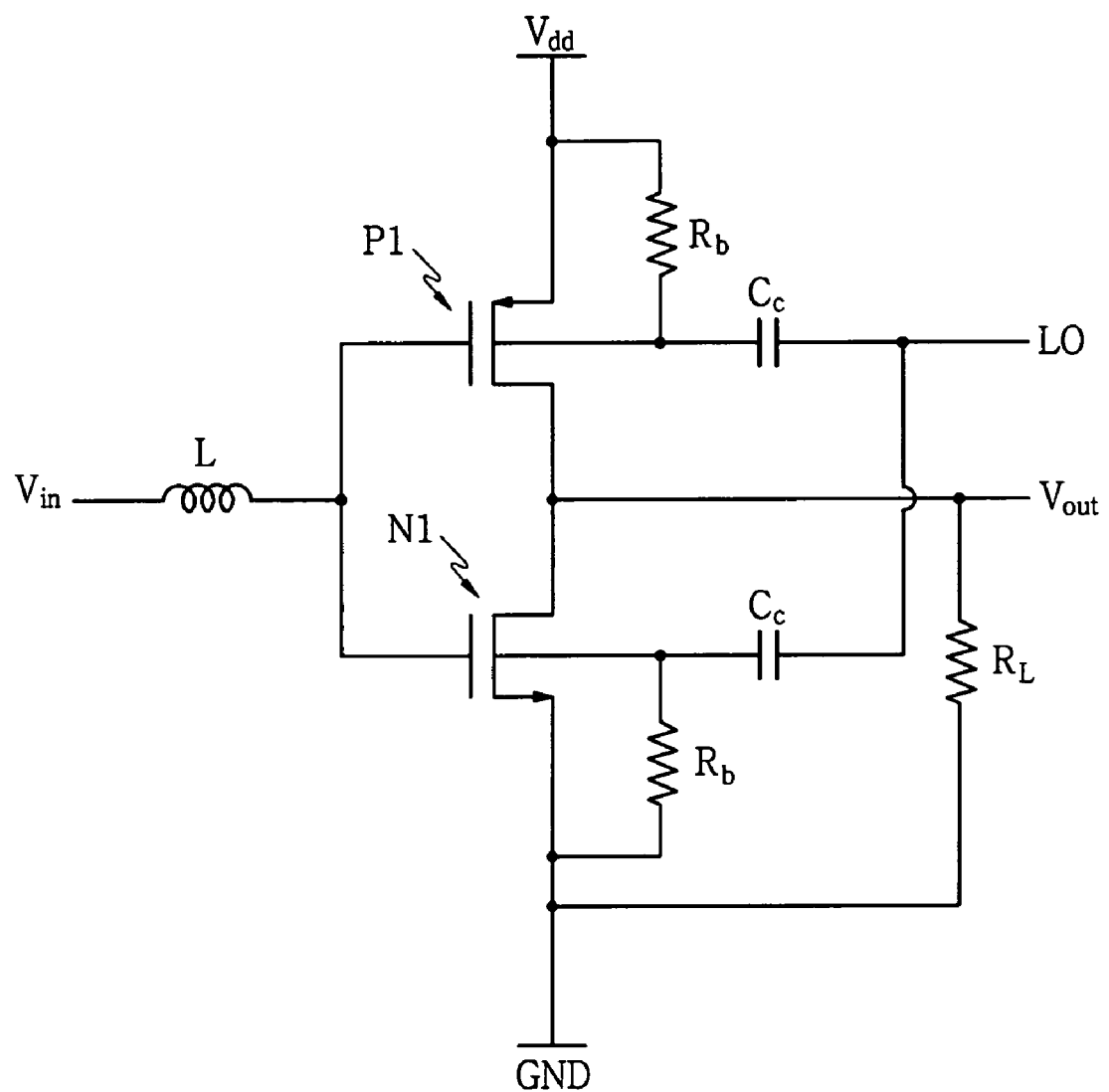
FIG. 3 is a circuit diagram of a frequency mixing apparatus according to an alternative embodiment of the present invention.

FIG. 3 is a circuit diagram of a frequency mixing apparatus according to an alternative embodiment of the present invention. Like reference numeral denote the same components as shown in FIG. 2 and redundant descriptions are avoided herein.

Referring to FIG. 3, the frequency mixing apparatus further includes resistors $R_b$ and $R_L$, capacitors $C_c$, and an inductor L in addition to the components illustrated in FIG. 2.

The inductor L is used for impedance matching of the input signal $V_{in}$, and the capacitors $C_c$ function to remove a DC component. The resistors $R_b$ and $R_L$ are provided to control a DC voltage.

In accordance with the present invention as described above, since an LO signal is applied to the bulk of a transistor, the resulting high isolation between the bulk and gate of the transistor prevents leakage of the LO signal, thereby decreasing a DC offset voltage. Hence, the frequency mixing apparatuses of the present invention are applicable to a direct conversion receiver (DCR). Especially, the present invention provides a DC offset attenuation method applicable to general-purpose terminals, not limited to particular applications.

In the frequency mixing apparatuses of the present invention, a PMOS transistor is coupled to an NMOS transistor in a cascade configuration, which is similar to an inverter configuration. Therefore, they can be incorporated in a field-programmable gate array (FPGA) of a MODEM in software-defined radio (SDR) applications.

In addition, frequency mixing based on switching of a threshold voltage decreases a noise factor and is viable in a low supply voltage range. Therefore, power consumption is decreased. Since the output comes from between the PMOS and NMOS transistors, a higher gain can be achieved by increasing an output impedance.

While traditionally, a different DC offset attenuation method is used, application by application, and applications for which DC offset attenuation is viable are limited, the present invention eliminates the cause of DC offsets. Accordingly, the present invention can find its use in all small-size, low-power terminals including $4^{th}$ generation (4G) mobile terminals as well as global system for mobile telecommunication (GSM), code division multiple access (CDMA), and wireless local area network (WLAN) terminals.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A frequency mixing apparatus comprising:
   a P-channel metal oxide semiconductor (PMOS) transistor having a source connected to a power voltage, a gate for receiving an input signal, and a bulk for receiving a local oscillator (LO) signal; and
   an N-channel metal oxide semiconductor (NMOS) transistor having a source connected to the ground, a drain connected to a drain of the PMOS transistor, a gate for receiving the input signal, and a bulk for receiving the LO signal,
   wherein the input signal is mixed with the LO signal and a mixed signal is output through the drains of the PMOS transistor and the NMOS transistor.

2. The frequency mixing apparatus of claim 1, further comprising:
   a first capacitor serially connected between the bulk of the PMOS transistor and a port to which the LO signal is applied; and
   a second capacitor serially connected between the bulk of the NMOS transistor and the port to which the LO signal is applied.

3. The frequency mixing apparatus of claim 1, further comprising:
   a first resistor connected in parallel between the source and bulk of the PMOS transistor; and
   a second resistor connected in parallel between the source and bulk of the NMOS transistor.

4. The frequency mixing apparatus of claim 1, further comprising a third resistor connected in parallel between the ground and a port which connects the drain of the PMOS transistor to the drain of the NMOS transistor.

5. The frequency mixing apparatus of claim 1, further comprising an inductor between a port to which the input signal is applied and a port which connects the gate of the PMOS transistor to the gate of the NMOS transistor.

* * * * *